(12) United States Patent
Lealman et al.

(10) Patent No.: US 10,302,861 B2
(45) Date of Patent: May 28, 2019

(54) SEMICONDUCTOR OPTICAL APPARATUS (71) Applicant: Huawei Technologies Co., Ltd., Shenzhen (CN)

(72) Inventors: Ian Lealman, Ipswich (GB); David Moodie, Ipswich (GB)

(73) Assignee: Huawei Technologies Co., Ltd., Shenzhen (CN)

( * ) Notice: Subject to any disclaimer, the term of this patent is extended or adjusted under 35 U.S.C. 154(b) by 39 days.

(21) Appl. No.: 15/728,149

(22) Filed: Oct. 9, 2017

(65) Prior Publication Data

US 2018/0031764 A1 Feb. 1, 2018

Related U.S. Application Data

(63) Continuation of application No. PCT/CN2016/099481, filed on Sep. 20, 2016.

(30) Foreign Application Priority Data

Sep. 21, 2015 (EP) .................................... 15186013

(51) Int. Cl.
*G02B 6/122* (2006.01)
*G02F 1/225* (2006.01)
(Continued)

(52) U.S. Cl.
CPC ....... *G02B 6/1228* (2013.01); *G02F 1/01708* (2013.01); *G02F 1/2257* (2013.01);
(Continued)

(58) Field of Classification Search
CPC ... G02B 6/14; G02B 6/1228; G02F 2202/108; H01S 5/1014
See application file for complete search history.

(56) References Cited

U.S. PATENT DOCUMENTS 5,985,685 A 11/1999 Lealman et al.
6,282,345 B1 8/2001 Schimpe
(Continued)

FOREIGN PATENT DOCUMENTS

CN 1142284 A 2/1997
CN 103956652 A 7/2014

OTHER PUBLICATIONS

Vusirikala et al., "1.55-um InGaAsP-InP Laser Arrays with Integrated-Mode Expanders Fabricated Using a Single Epitaxial Growth," IEEE Journal of Selected Topics in Quantum Electronics, XP011062333, Institute of Electrical and Electronic Engineers, New York, New York (Dec. 1997).
(Continued)

*Primary Examiner* — Ryan A Lepisto
*Assistant Examiner* — Erin D Chiem
(74) *Attorney, Agent, or Firm* — Leydig, Voit & Mayer, Ltd.

(57) ABSTRACT

A semiconductor optical apparatus is disclosed, wherein the semiconductor optical apparatus comprises a first waveguide region defining a first mode size and a second active waveguide region defining a second mode size being smaller than the first mode size. The second active waveguide region is optically coupled to the first waveguide region and the second active waveguide region comprises a lower multiple quantum well layer and an upper multiple quantum well layer located above the lower multiple quantum well layer. The lower multiple quantum well layer is physically separated from the upper multiple quantum well layer by a spacer layer. The upper multiple quantum well layer comprises a mode transformation region configured to reduce the size of an optical mode from the first mode size to the second mode size.

20 Claims, 3 Drawing Sheets

(51) Int. Cl.
*G02F 1/017* (2006.01)
*H01S 5/50* (2006.01)
*H01S 5/026* (2006.01)
*H01S 5/20* (2006.01)
*H01S 5/10* (2006.01)
*G02B 6/12* (2006.01)
*G02B 6/13* (2006.01)
*G02B 6/136* (2006.01)
*G02B 6/14* (2006.01)
*G02F 1/21* (2006.01)
*H01S 5/22* (2006.01)
*H01S 5/343* (2006.01)
*H01S 5/02* (2006.01)

(52) U.S. Cl.
CPC ............ *H01S 5/026* (2013.01); *H01S 5/1014* (2013.01); *H01S 5/2031* (2013.01); *H01S 5/50* (2013.01); *G02B 6/12004* (2013.01); *G02B 6/131* (2013.01); *G02B 6/136* (2013.01); *G02B 6/14* (2013.01); *G02B 2006/1215* (2013.01); *G02B 2006/12159* (2013.01); *G02F 2001/212* (2013.01); *G02F 2202/108* (2013.01); *H01S 5/0208* (2013.01); *H01S 5/1032* (2013.01); *H01S 5/22* (2013.01); *H01S 5/34306* (2013.01)

(56) References Cited

U.S. PATENT DOCUMENTS 9,229,168 B2 * 1/2016 Furuya .................. G02B 6/305
2003/0086654 A1   5/2003 Saini et al.
2014/0133817 A1 * 5/2014 Lealman ............. G02B 6/1228
                                                              385/129

OTHER PUBLICATIONS

Saini et al., "Passive Active Resonant Coupler (PARC) Platform with Mode Expander", IEEE Photonics Technology Letters, vol. 12, No. 8, pp. 1025-1027, Institute of Electrical and Electronics Engineers, New York, New York (Aug. 2000).

Koch et al., "Tapered Waveguide InGaAs/InGaMP Multiple-Quantum-Well Lasers", IEEE Photonics Technology Letters, vol. 2, No. 2, pp. 88-90, Institute of Electrical and Electronics Engineers, New York, New York (Feb. 1990).

Shibata et. al., "Lossless Operation in InP Mach-Zehnder Modulator Monolithically Integrated with Semiconductor Optical Amplifier", Semiconductor Technologies, pp. 407-418, InTech (2010).

* cited by examiner

SEMICONDUCTOR OPTICAL APPARATUS

CROSS REFERENCE TO RELATED APPLICATIONS

This application is a continuation of International Application No. PCT/CN2016/099481, filed on Sep. 20, 2016, which claims priority to European Patent Application Number EP15186013.7, filed on Sep. 21, 2015. The disclosures of the aforementioned applications are hereby incorporated by reference in their entireties.

TECHNICAL FIELD

Embodiments of the present invention relate to a semiconductor optical apparatus. In particular, the present invention relates to a semiconductor optical apparatus for a Mach Zehnder modulator.

BACKGROUND

In recent years, optical modulators that modulate light in response to RF signals have become one of the essential components in configuring optical fiber communication networks. In particular, a Mach Zehnder interferometer type optical modulator (or short "Mach Zehnder modulator (MZM)") that uses a waveguide-type optical interferometer enables high-speed modulation of 40 Gbps or higher. However, as the bit rates in optical communication networks increase optical loss in optoelectronic network components, such as Mach Zehnder modulators, becomes more of an issue. To overcome this problem there have been attempts to integrate semiconductor optical amplifiers (SOAs), fixed wavelength lasers, tuneable lasers and other active sections into MZM devices.

To minimize device length and maximize speed in the phase modulating (PM) core of an MZM the multiple quantum well (MQW) core typically needs a large number of quantum wells, for instance, 20 to 30 or more. This results in a very tightly confined optical mode, which, in turn, leads to a very large angular divergence (with a typical FWHM of the far field being larger than 50 degrees). Such a large angular divergence and small mode size result in very poor coupling efficiency between an MZM and an optical fiber, as well as very tight alignment tolerances.

To overcome this issue, a lot of conventional devices incorporate a waveguide mode transformer on the input and output facet of the MZM. The waveguide mode transformer is generally realized by selective area epitaxy to butt couple the passive waveguide mode transformer to the MZM core, because selective area epitaxy allows both the thickness and band gap of the regrown material to be varied as a function of length by the use of a patterned oxide mask. However, such an additional growth step adds fabrication complexity and can reduce device yield resulting in an increase in device costs.

Moreover, the tightly confined optical mode of the MZM core is also not well matched to that required for other active optical elements including SOAs and laser gain regions that need to be monolithically integrated with the MZM. Typical SOA or laser gain regions require about 3 to 6 quantum wells and operate at a much lower optical confinement factor of between 20 to 30% compared to around 70% for the MZM phase modulating core.

Again to overcome this difference in optimum design a mode transformer or expander is typically required between the SOA or laser active and phase modulating region of the device, to modify the mode size without introducing excessive loss and/or reflection. Again this has traditionally been done using selective area epitaxy.

Since the inclusion of an SOA and or laser gain region already requires the use of an additional stage of regrowth to grow the gain regions the addition of yet another step to add the mode transformer again has the potential to reduce yield.

There is, therefore, a need for an improved semiconductor optical apparatus, in particular an improved semiconductor optical apparatus allowing to simplify mode expansion at the facet of a Mach Zehnder Modulator (MZM) and to simplify the integration of an MZM core with forward biased active sections such as semiconductor optical amplifiers (SOAs) or semiconductor lasers.

SUMMARY

It is an object of the invention to provide an improved semiconductor optical apparatus, in particular an improved semiconductor optical apparatus allowing in particular to simplify mode expansion at the facet of a Mach Zehnder Modulator (MZM) and in particular to simplify the integration of an MZM core with forward biased active sections such as semiconductor optical amplifiers (SOAs) or semiconductor lasers, as well as a method of manufacturing such an improved semiconductor optical apparatus.

This object is achieved by the subject matter of the independent claims. Further implementation forms are provided in the dependent claims, the description and the figures.

According to a first aspect the invention relates to a semiconductor optical apparatus, wherein the semiconductor optical apparatus comprises a first waveguide region defining a first mode size and a second active waveguide region defining a second mode size being smaller than the first mode size. The second active waveguide region is optically coupled to the first waveguide region and the second active waveguide region comprises a lower multiple quantum well layer and an upper multiple quantum well layer located above the lower multiple quantum well layer. The lower multiple quantum well layer is physically separated from the upper multiple quantum well layer by a spacer layer. The upper multiple quantum well layer comprises a mode transformation region configured to reduce the size of an optical mode from the first mode size to the second mode size.

In a first possible implementation form of the semiconductor optical apparatus according to the first aspect of the invention, the first waveguide region is a first waveguide active region comprising a further multiple quantum well layer, wherein the modal index defined by the further multiple quantum well layer is substantially equal to the modal index defined by the lower multiple quantum well layer of the second waveguide region.

In a second possible implementation form of the semiconductor optical apparatus according to the first aspect of the invention as such or the first implementation form thereof, the mode transformation region comprises a tapered width region increasing in width away from the start of the second active waveguide region, where the second active waveguide region is optically coupled to the first waveguide region.

In a third possible implementation form of the semiconductor optical apparatus according to the first aspect of the invention as such or the first or second implementation form thereof, the thickness of the spacer layer is smaller than about 0.25 μm, in particular smaller than about 0.1 μm.

In a fourth possible implementation form of the semiconductor optical apparatus according to the first aspect of the invention as such or any one of the first to third implementation form thereof, the spacer layer comprises undoped indium phosphide or low doped indium phosphide with a concentration of less than 1016 cm-3.

In a fifth possible implementation form of the semiconductor optical apparatus according to the first aspect of the invention as such or any one of the first to fourth implementation form thereof, the optical confinement factor defined by the first waveguide region is about 0.2 to 0.3.

In a sixth possible implementation form of the semiconductor optical apparatus according to the first aspect of the invention as such or any one of the first to fifth implementation form thereof, the optical confinement factor defined by the second active waveguide region is about 0.47 or higher.

In a seventh possible implementation form of the semiconductor optical apparatus according to the first aspect of the invention as such or any one of the first to sixth implementation form thereof, the first waveguide region is butt-coupled to the lower multiple quantum well layer of the second active waveguide region.

In an eighth possible implementation form of the semiconductor optical apparatus according to the first aspect of the invention as such or any one of the first to seventh implementation form thereof, the semiconductor optical apparatus comprises a semiconductor optical amplifier or a semiconductor optical laser providing the first active waveguide region.

In a ninth possible implementation form of the semiconductor optical apparatus according to the eighth implementation form of the first aspect of the invention, the semiconductor optical laser is a ridge waveguide laser or a buried heterostructure laser.

In a tenth possible implementation form of the semiconductor optical apparatus according to the first aspect of the invention as such or any one of the first to ninth implementation form thereof, the first waveguide region and the second active waveguide region are monolithically integrated on a common substrate.

In an eleventh possible implementation form of the semiconductor optical apparatus according to the first aspect of the invention as such or any one of the first to tenth implementation form thereof, the semiconductor optical apparatus further comprises a mode transformer for optically coupling the first waveguide region to the second active waveguide region.

According to a second aspect the invention relates to a Mach Zehnder modulator comprising an input arm and at least one output arm, wherein the input arm and/or the output arm comprises a semiconductor optical apparatus according to the first aspect of the invention as such or any one of its implementation forms.

In an implementation form of the Mach Zehnder modulator according to the second aspect of the invention, the Mach Zehnder modulator is configured to operate as a switch in an optical communication network.

According to a third aspect the invention relates to a method of manufacturing a semiconductor optical apparatus, wherein the method comprises the following steps: growing a first waveguide region on a substrate and coating the first waveguide region with a cladding layer, wherein the first waveguide region defines a first mode size; growing a lower multiple quantum well layer on the substrate; growing a spacer layer on the lower multiple quantum well layer; growing an upper multiple quantum well layer on the spacer layer, wherein the upper multiple quantum well layer and the lower multiple quantum well layer define a second active waveguide region being optically coupled to the first waveguide region and wherein the second active waveguide region defines a second mode size being smaller than the first mode size; and etching a mode transformation region into the upper multiple quantum well layer configured to reduce the size of an optical mode from the first mode size to the second mode size.

In an implementation form of the method according to the third aspect of the invention, the step of etching a mode transformation region into the upper multiple quantum well layer comprises the step of etching a tapered width region into the upper multiple quantum well layer increasing in width away from the start of the second active waveguide region, where the second active waveguide region is optically coupled to the first waveguide region.

In an implementation form of the method according to the third aspect of the invention, the steps of growing a first waveguide region on a substrate and coating the first waveguide region with a cladding layer comprise the additional steps of patterning the first waveguide region, etching away portions of the patterned first waveguide region and selectively growing a further multiple quantum well layer in the locations, where the first waveguide region has been removed.

In an implementation form of the method according to the third aspect of the invention, the method comprises the further steps of growing undoped InP and InGaAs layers above the multiple quantum well layers and Zn diffusing into sections that require current injection or voltage tuning.

BRIEF DESCRIPTION OF THE DRAWINGS

Further embodiments of the invention will be described with respect to the following figures, in which:

FIG. 1b shows a schematic cross-sectional view of the semiconductor optical apparatus of FIG. 1a;

DETAILED DESCRIPTION OF EMBODIMENTS

In the following detailed description, reference is made to the accompanying drawings, which form a part of the disclosure, and in which are shown, by way of illustration, specific aspects in which the disclosure may be practiced. It is understood that other aspects may be utilized and structural or logical changes may be made without departing from the scope of the present disclosure. The following detailed description, therefore, is not to be taken in a limiting sense, and the scope of the present invention is defined by the appended claims.

It is understood that a disclosure in connection with a described method may also hold true for a corresponding device or system configured to perform the method and vice versa. For example, if a specific method step is described, a corresponding device may include a unit to perform the described method step, even if such unit is not explicitly described or illustrated in the figures. Further, it is understood that the features of the various exemplary aspects described herein may be combined with each other, unless specifically noted otherwise.

The devices and methods described herein may be implemented for producing integrated optical chips. The described devices and systems may include integrated circuits and may be manufactured according to various technologies. For example, the circuits may include logic integrated circuits, analog integrated circuits, mixed signal integrated circuits, optical circuits and/or memory circuits.

In the following description devices and methods using optical waveguides are described. An optical waveguide is a physical structure that guides electromagnetic waves in the optical spectrum. Common types of optical waveguides include optical fiber and rectangular waveguides. Optical waveguides can be classified according to their geometry, e.g. as planar, strip, or fiber waveguides, mode structure, e.g. as single-mode or multi-mode, refractive index distribution, e.g. step or gradient index distribution and material, e.g. glass, polymer or semiconductor.

Figure 1A:
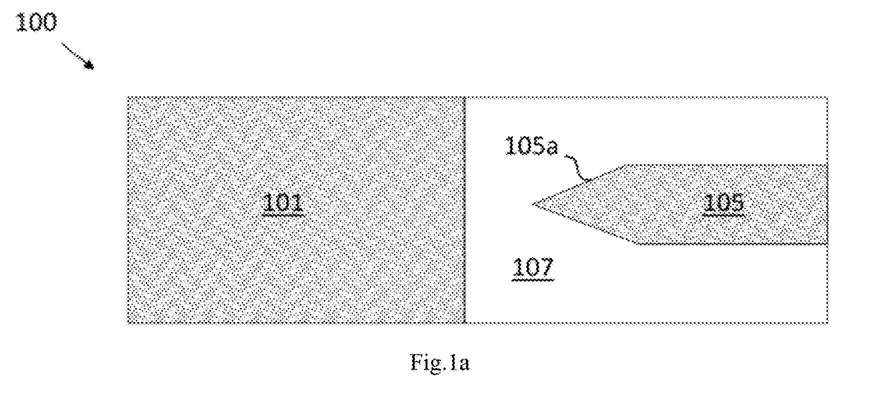
FIG. 1a shows a schematic top plan view of a semiconductor optical apparatus according to an embodiment during a manufacturing stage.
Figure 1B:
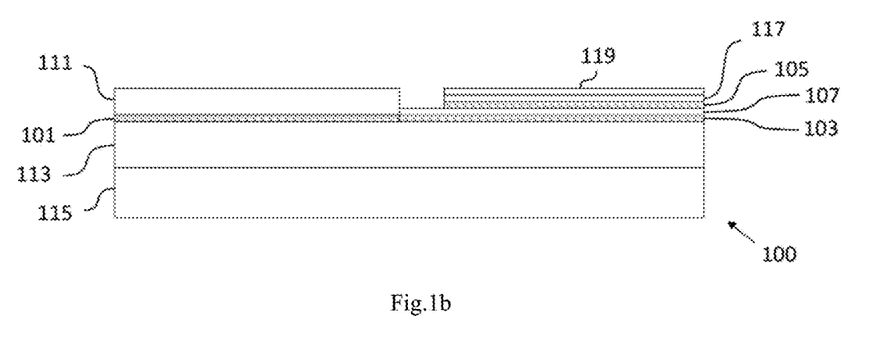

FIG. 1a shows a schematic top plan view of a semiconductor optical apparatus 100 according to an embodiment during a manufacturing stage. A schematic cross-sectional view of the semiconductor optical apparatus 100 according to an embodiment during a manufacturing stage is shown in FIG. 1b.

In an embodiment, the semiconductor optical apparatus 100 can comprise a substrate including a first substrate layer 115 and a second substrate layer 113. In an embodiment, the first substrate layer 115 can comprise semi-insulating InP and the second substrate layer 113, often referred to as a buffer layer, can comprise n doped InP.

The semiconductor optical apparatus 100 comprises a first waveguide region 101. In an embodiment, the first waveguide region 101 is arranged in form of a layer on top of a part of the second substrate layer 113. The first waveguide region 101 is configured to guide optical radiation. In an embodiment, a first cladding layer 111 can be arranged on top of the first waveguide region 101. In an embodiment, the first cladding layer 111 can comprise p-doped InP.

Furthermore, the semiconductor optical apparatus 100 comprises a second waveguide region, which is an active waveguide region, herein referred to as the second active waveguide region. The second active waveguide region comprises a lower multiple quantum well layer 103 and an upper multiple quantum well layer 105 located above the lower multiple quantum well layer 103 and is optically coupled to the first waveguide region 101. In an embodiment, a layer 117 of undoped InP can be arranged on top of the upper multiple quantum well layer 105. In an embodiment, a second cladding layer 119 can be arranged on top of layer 117. In an embodiment, the second cladding layer 119 can be made of the same material as the first cladding layer 111, in particular p-doped InP.

In an embodiment, the first waveguide region 101 is butt-coupled to the lower multiple quantum well layer 103 of the second active region. In an alternative embodiment, the semiconductor optical apparatus 100 further comprises a mode transformer for optically coupling the first active region 101 to the second active waveguide region.

The lower multiple quantum well layer 103 is physically separated from the upper multiple quantum well layer 105 by a spacer layer 107. In an embodiment, the spacer layer 107 can comprise un-doped indium phosphide (InP) or low doped indium phosphide having a concentration of less than 1016 cm-3. In an embodiment, the thickness of the spacer layer 107 in vertical direction (i.e. the distance between the lower multiple quantum well layer 103 and the upper multiple quantum well layer 105) is smaller than about 0.25 µm, in particular smaller than about 0.1 µm.

The upper multiple quantum well layer 105 comprises a mode transformation region 105a configured to reduce the size of an optical mode from the first mode size defined by the first waveguide region 101 to the second mode size defined by the second active waveguide region. In an embodiment, the mode transformation region 105a is defined by a tapered width region 105a increasing in width away from the start of the second active waveguide region, where the second active waveguide region is optically coupled to the first waveguide region 101, as can be taken from the top-plan view shown in FIG. 1a. In the embodiment shown in FIGS. 1a and 1b, the lower multiple quantum well layer 103 is directly coupled to the first waveguide region 101 and the upper multiple quantum well layer 105 is separated from the first waveguide region 101 by a region between the first waveguide region 101 and the tip of the tapered width region 105a of the upper multiple quantum well layer 105.

Figure 2A:
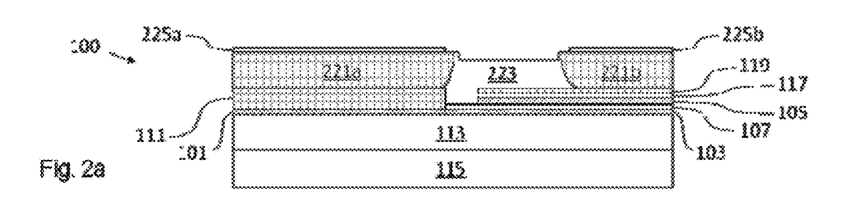
FIG. 2a shows a schematic cross-sectional view of a semiconductor optical apparatus according to an embodiment.
Figure 2B:
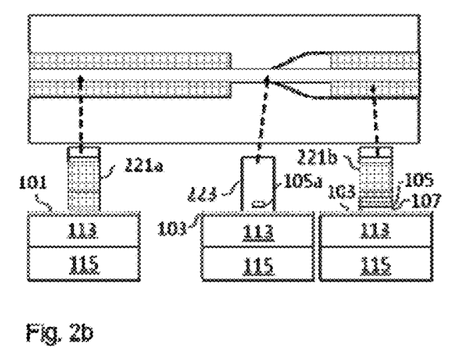
FIG. 2b shows a schematic top plan view as well as schematic cross sectional views of the semiconductor optical apparatus shown in FIG. 2a during a manufacturing stage.
Figure 2C:
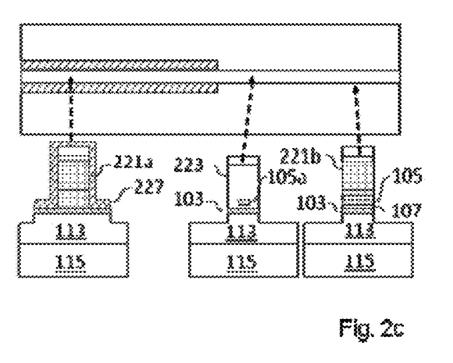
FIG. 2c shows a schematic top plan view as well as schematic cross sectional views of the semiconductor optical apparatus shown in FIG. 2a during a further manufacturing stage.

FIGS. 2a, 2b and 2c illustrate the embodiment of the semiconductor optical apparatus 100 shown in FIGS. 1a and 1b, which has been processed using further epitaxial and diffusion steps. In addition to the elements of the embodiment of the semiconductor optical apparatus 100 shown in FIGS. 1a and 1b the embodiment of the semiconductor optical apparatus 100 shown in FIGS. 2a, 2b and 2c comprises Zn diffused regions 221a and 221b, an isolation and mode expansion region 223 as well as contacts 225a and 225b.

FIG. 2a is a side view of the semiconductor optical apparatus 100 according to an embodiment after completion of all of the epitaxial steps and the diffusion and is taken down the centre line of the plan view shown in FIG. 2b. The top image of FIG. 2b shows how the ridge waveguide core is aligned to the Zn diffused regions 221a and 221b and the tapered upper multiple quantum well layer 105. The cross sections at the bottom of FIG. 2b show the structure of the ridge waveguide after a 1st etching step to define the ridge waveguide. The cross-section at the left of FIG. 2b shows the structure of the ridge waveguide in the first waveguide region 101 (as the person skilled in the art will appreciate, above the first active waveguide region 101 a stop etch layer (or layers) may be provided so that the etch stopped just above the first active waveguide region 101), the cross-section in the middle of FIG. 2b shows the structure of the ridge waveguide in the second active waveguide region near the start of the taper, i.e. the mode transformation region 105a, where the upper multiple quantum well layer 105 is narrower than the ridge waveguide, and the cross-section at the right of FIG. 2b shows the structure of the ridge waveguide after the mode transformation region 105a.

As already described above in the context of FIGS. 1a and 1b, the first waveguide region 101 is configured to guide optical radiation having a first mode size along the first waveguide region 101. The first waveguide region 101 defines a first mode size for optical radiation guided along the first waveguide region 101. The first mode size is defined primarily by the first waveguide region 101. In an embodiment, the first mode size can be defined additionally by the first cladding layer 111, the second substrate layer 113 and/or the Zn diffused region 221a.

The second active waveguide region comprising the lower multiple quantum well layer 103 and the upper multiple quantum well layer 105 defines a second mode size for optical radiation guided along the second active waveguide region, wherein the second mode size is smaller than the first mode size defined by the first waveguide region 101.

As already described above in the context of FIGS. 1a and 1b, the upper multiple quantum well layer 105 comprises a mode transformation region 105a. The mode transformation region 105a is configured to reduce the size of an optical mode from the first mode size defined by the first waveguide region 101 to the second mode size defined by the second active waveguide region. In an embodiment, the mode transformation region 105a is defined by a tapered width region 105a increasing in width away from the start of the second active waveguide region, i.e. where the second active waveguide region interfaces with the first waveguide region 101.

In an embodiment, also the first waveguide region 101 of the semiconductor optical apparatus 100 is configured as an active waveguide region (herein referred to as first waveguide active region 101) comprising a further multiple quantum well layer, wherein the modal index defined by the further multiple quantum well layer is substantially equal to the modal index defined by the lower multiple quantum well layer 103.

In an embodiment, the first active waveguide region 101 is configured to amplify optical radiation guided along the first active waveguide region 101. In an embodiment, the semiconductor optical apparatus 100 comprises a semiconductor optical amplifier or a semiconductor optical laser defining the first active waveguide region 101. In an embodiment, the semiconductor optical laser is a ridge waveguide laser or a buried heterostructure laser.

For the semiconductor optical apparatus 100 shown in FIGS. 2a to 2c to be implemented in a Mach Zehnder modulator (MZM) it is generally necessary to etch even deeper compared to what is shown in FIG. 2b so that the second active waveguide region is cut through, as illustrated in FIG. 2c. Consequently, in an embodiment an additional masking step is provided in the form of a further oxide mask 227 in FIG. 2c to protect the SOA/laser region while allowing the ridge to be more deeply etched in the MZM region.

As known to the person skilled in the art, there might be of course further additional masking and processing steps required after the steps illustrated in FIGS. 2a-c to realize an MZM or an integrated SOA/MZM, but those would be common to a device manufactured using the existing approaches. These would include passivating layers with windows opened over the ridge in regions where an electrical contact is required for current injection or to apply a reverse voltage to the core layers in the second active waveguide region. There would also be processing required to deposit and pattern the metal layers above this needed to supply said current or voltage.

Figure 3:
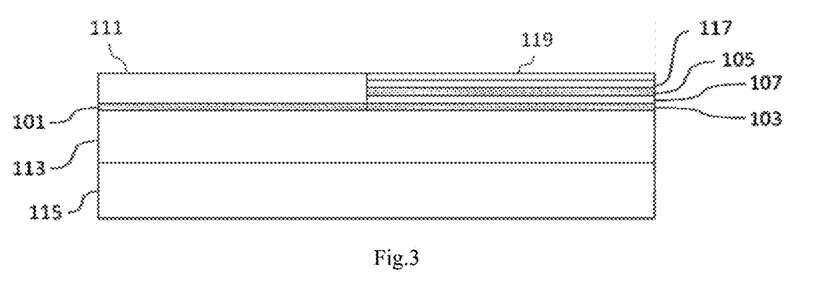
FIG. 3 shows a schematic cross-sectional view of a semiconductor optical apparatus according to an embodiment during a further manufacturing stage.

FIG. 3 shows a schematic cross-sectional view of the semiconductor optical apparatus 100 of FIGS. 1a and 1b and FIGS. 2a to 2c during a further manufacturing stage, namely prior to manufacturing the mode transformation region in the form of the tapered width region 105a of the upper multiple quantum well layer 105 of the semiconductor optical apparatus 100.

A semiconductor optical apparatus 100 according to the invention can be manufactured by means of a method comprising the following steps. A first step of growing a first waveguide region 101 on a substrate 113, 115 and coating the first waveguide region 101 with a first cladding layer 111, wherein the first waveguide region 101 defines a first mode size. A second step of growing a lower multiple quantum well layer 103 on the substrate 113, 115. A third step of growing a spacer layer 107 on the lower multiple quantum well layer 103. A fourth step of growing an upper multiple quantum well layer 105 on the spacer layer 107, wherein the upper multiple quantum well layer 105 and the lower multiple quantum well layer 103 define a second active waveguide region being optically coupled to the first waveguide region 101 and wherein the second active waveguide region defines a second mode size being smaller than the first mode size defined by the first waveguide region 101. A fifth step of etching a mode transformation region 105a into the upper multiple quantum well layer 107 configured to reduce the size of an optical mode from the first mode size to the second mode size.

In an embodiment, the fifth step of etching a mode transformation region 105a into the upper multiple quantum well layer 105 comprises the step of etching a tapered width region 105a into the upper multiple quantum well layer 105 increasing in width away from the start of the second active waveguide region, where the second active waveguide region is optically coupled to the first waveguide region 101.

In an embodiment, the first step of growing a first waveguide region 101 on a substrate 113, 115 and coating the first waveguide region 101 with a first cladding layer 111 comprise the additional steps of patterning the first waveguide region 101 and/or the first cladding layer 111, etching away portions of the patterned first waveguide region 101 and/or the first cladding layer 111 and selectively growing a further multiple quantum well layer in the locations, where the first waveguide region 101 and/or the first cladding layer 111 has been removed (a process known to the person skilled in the art as a butt coupled growth or selective area epitaxy).

In an embodiment, the method comprises the further steps of growing undoped InP and InGaAs layers above the multiple quantum well layers and Zn diffusing into sections that require current injection or voltage tuning.

Figure 4:
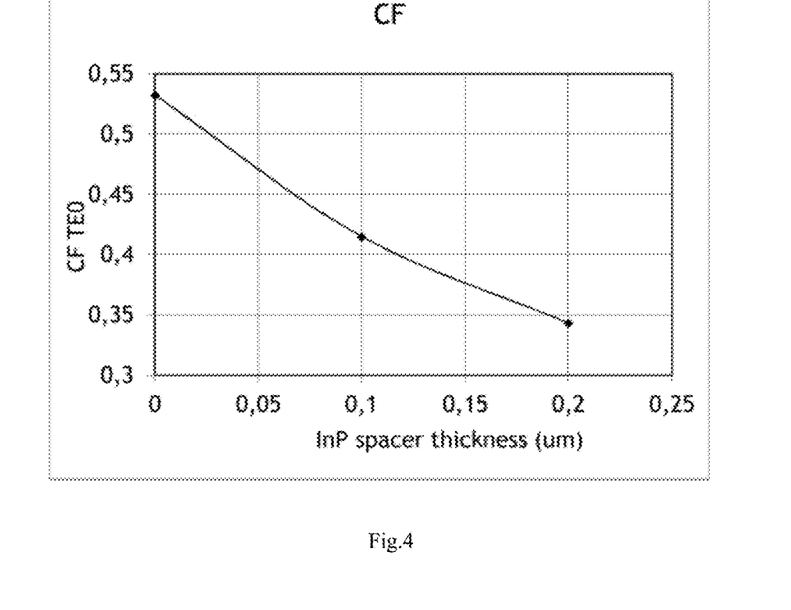
FIG. 4 shows a diagram illustrating the relation between the thickness of a spacer layer and the confinement factor for a semiconductor optical apparatus according to an embodiment.

FIG. 4 shows a diagram illustrating the relation between the thickness of the spacer layer 107 and the confinement factor (CF) defined by the second active waveguide region of the semiconductor optical apparatus 100 shown in the previous figures. FIG. 4 is based on a model with a second active waveguide region containing 20 wells split into a lower multiple quantum well layer 103 containing ten wells and an upper multiple quantum well layer 105 containing ten wells, in particular with a 0.2 um thick, InP spacer layer 107 between these layers.

As can be taken from FIG. 4, the confinement factor (CF) defined by the second active waveguide region for an exemplary optical mode varies strongly with the thickness of the InP spacer layer 107, in particular increases for smaller thicknesses of the spacer layer 107. In an embodiment, the optical confinement factor defined by the second active waveguide region is about 0.47 or higher. In an embodiment, the optical confinement factor defined by the first waveguide region 101 is about 0.2 to 0.3. In the model the width of the lower multiple quantum well layer 103 tapers in from 2.3 to 1.4 um and the upper multiple quantum well layer 105 tapers out from 0.3 to 1.4 um. Other split ratios more suited to different PM and SOA or laser designs could also be employed.

Figure 5:
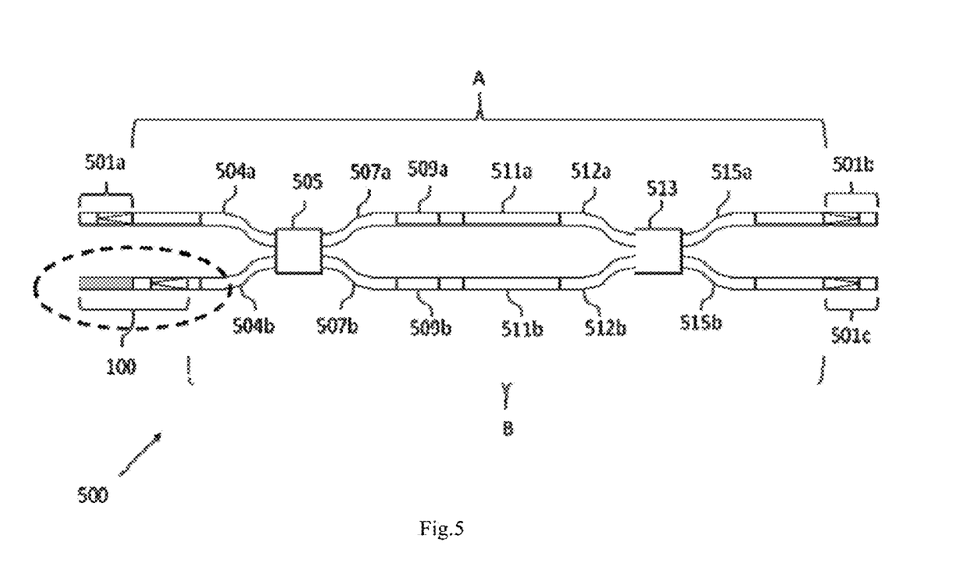
FIG. 5 shows a schematic top plan view of a Mach Zehnder modulator including a semiconductor optical apparatus according to an embodiment.

FIG. 5 shows a schematic top plan view of a Mach Zehnder modulator (MZM) 500 including a semiconductor optical apparatus according to an embodiment, for instance the semiconductor optical apparatus 100 shown in FIGS. 2a to 2c.

The MZM 500 comprises two input arms on the left hand side and two output arms on the right hand side. The input arm of the MZM 500 on the lower left hand side of FIG. 5 comprises a semiconductor optical apparatus according to an embodiment, for instance the semiconductor optical apparatus 100 shown in FIGS. 2a to 2c. In an embodiment, the MZM 500 is configured to operate as a switch in an optical communication network.

In an embodiment the MZM 500 further comprises the following elements: MMI couplers 505 and 513, waveguide bends 504a, 504b, 507a, 507b, 512a, 512b, 515a and 515b to bring the waveguides into and out of the MIMI couplers 505 and 513, phase adjusters 509a and 509b and RF phase modulators 511a and 511b for high speed RF operation, which will be described in more detail further below.

In an embodiment, the input arm of the MZM 500 on the upper left hand side of FIG. 5 can comprise an optical element 501a that is essentially a half of the semiconductor optical apparatus 100 shown in FIGS. 2a to 2c, namely the half of the semiconductor optical apparatus 100 shown in FIGS. 2a to 2c defining the second active waveguide region comprising the lower multiple quantum well layer 103 and the upper multiple quantum well layer 105 separated by the spacer layer 107. In an alternative embodiment, the input arm of the MZM 500 on the upper left hand side of FIG. 5 can comprise a semiconductor optical apparatus according to an embodiment, for instance the semiconductor optical apparatus 100 shown in FIGS. 2a to 2c. Likewise, the output arms of the MZM 500 on the upper and lower right hand side of FIG. 5 can comprise optical elements 501b and 501c that are essentially a half of the semiconductor optical apparatus 100 shown in FIGS. 2a to 2c, namely the half of the semiconductor optical apparatus 100 shown in FIGS. 2a to 2c defining the second active waveguide region comprising the lower multiple quantum well layer 103 and the upper multiple quantum well layer 105 separated by the spacer layer 107. In an alternative embodiment, the output arms of the MZM 500 on the upper and lower right hand side of FIG. 5 can comprise a semiconductor optical apparatus according to an embodiment, for instance the semiconductor optical apparatus 100 shown in FIGS. 2a to 2c.

The portions A and B of the MZM 500, which cover most of the length thereof, include the full regrown MZM core with both multiple quantum well layers 103 and 105. The high optical confinement is generally needed over most of the device since it is necessary to minimize the length of the RF phase modulators 511a and 511b that constitute the section of the MZM 500 that modulates the light. This high confinement structure also has the advantage of allowing the waveguide bends 504a, 504b, 507a, 507b, 512a, 512b, 515a and 515b to be short, again minimizing the overall length of the MZM 500, e.g. the length of the chip implementing the MZM 500. Generally, the higher the optical confinement of a waveguide the tighter the bend radius that can be used before light is scattered out. Obviously, a tighter bend takes less space, which reduces the chip size and cost. Since all waveguides also have a low background optical loss, reducing the length also reduces this background loss.

In FIG. 5 the multimode interference (MMI) couplers 505 and 513 are shown as 2×2 couplers (i.e. 2 waveguides at each end), but can be designed to have any reasonable number of optical ports from 1 to many at either end.

The DC phase adjusters 509a and 509b can be configured to use voltage, forward current or on chip heaters for phase adjustment (if heaters are used this section does not require the Zn diffusion regions). As known to the person skilled in the art, the phase adjusters 509a and 509b are generally provided to compensate for fabrication errors leading to different lengths of the two arms of the MZM 500.

The RF phase modulators 511a and 511b arranged along the two arms of the MZM 500 are used to modulate the intensity of the light at the output arm(s) at high speed by applying an AC voltage to one or both arms of the MZM 500.

In an embodiment, Zn diffused InP and/or InGaAs contacts can be used to form p contacts in regions where voltage is applied across the core of the MZM 500 or current is injected into the core to tune the phase.

In an embodiment, the waveguides of the MZM 500 can comprise portions of varying widths. These width variations can occur, for instance, in the region of the MZM 500 enclosed in the ellipse shown in dashed lines in FIG. 5. Similar or the same width variations could also be applied at the other input arm and/or the other output arms of the MZM 500. In such an embodiment, the waveguide in the first active waveguide region 101 and the second active waveguide region in front of the tapered region, i.e. the mode transformation region 105a, could be about 2.3 μm wide. In the second active waveguide region the lower multiple quantum well layer 103 could taper from a width of about 2.3 μm at the start of the mode transformation region 105a to a width of about 1.4 μm at the end of the mode transformation region 105a, while the upper multiple quantum well layer 105 could taper up from a start width between about 0 and 0.3 μm defining the start of the mode transformation region 105a to about 1.4 μm defining the end of the mode transformation region 105a. These width variations are beneficial since for the SOA section the best performance will typically be achieved for a ridge width of around 2 μm or slightly wider, while in the highly confined MZM core this width would result in the waveguide supporting an unwanted higher order transverse mode, hence tapering it down to around 1.4 μm makes sure this mode is not supported.

Embodiments of the invention allow overcoming the limitations of the prior art by splitting the phase modulating multiple quantum well into two layers separated by an undoped InP spacer layer. In embodiment of the invention the dimensions of this InP spacer layer are chosen to ensure it has a minimal impact on the performance of the phase modulating function. One of the advantages of such an approach is that the lower multiple quantum well layer can be mode matched to the active core, i.e. the first active waveguide region, of a semiconductor optical amplifier (SOA) or laser. The upper multiple quantum well layer can then be removed by etching adjacent to the SOA or laser and then patterned to form a taper that can be used to mode transform from the moderate mode size of the SOA or laser to the very small high confinement mode required in the phase modulating core. Since the mode in the SOA or laser is still moderately confined with a modal index well above that of the background material index such a mode transformer can be made short, i.e. probably ~100 μm.

Moreover, the use of the split multiple quantum well and the patterning of a taper in the upper multiple quantum well layer allows the taper between the PM and SOA or laser section of the device to be realized without the need for an additional stage of regrowth.

The methods, systems and devices described herein may be implemented as optical circuit within a chip or an photonic integrated circuit or an application specific integrated circuit (ASIC). The invention can be implemented in digital and/or analogue electronic and optical circuitry.

While a particular feature or aspect of the disclosure may have been disclosed with respect to only one of several implementations or embodiments, such feature or aspect may be combined with one or more other features or aspects of the other implementations or embodiments as may be desired and advantageous for any given or particular application. Furthermore, to the extent that the terms "include", "have", "with", or other variants thereof are used in either the detailed description or the claims, such terms are intended to be inclusive in a manner similar to the term "comprise". Also, the terms "exemplary", "for example" and "e.g." are merely meant as an example, rather than the best or optimal. The terms "coupled" and "connected", along with derivatives may have been used. It should be understood that these terms may have been used to indicate that two elements cooperate or interact with each other regardless whether they are in direct physical or electrical contact, or they are not in direct contact with each other.

Although specific aspects have been illustrated and described herein, it will be appreciated by those of ordinary skill in the art that a variety of alternate and/or equivalent implementations may be substituted for the specific aspects shown and described without departing from the scope of the present disclosure. This application is intended to cover any adaptations or variations of the specific aspects discussed herein.

Although the elements in the following claims are recited in a particular sequence with corresponding labeling, unless the claim recitations otherwise imply a particular sequence for implementing some or all of those elements, those elements are not necessarily intended to be limited to being implemented in that particular sequence.

Many alternatives, modifications, and variations will be apparent to those skilled in the art in light of the above teachings. Of course, those skilled in the art readily recognize that there are numerous applications of the invention beyond those described herein. While the present invention has been described with reference to one or more particular embodiments, those skilled in the art recognize that many changes may be made thereto without departing from the scope of the present invention. It is therefore to be understood that within the scope of the appended claims and their equivalents, the invention may be practiced otherwise than as specifically described herein.

What is claimed is:

1. A semiconductor optical apparatus, comprising:
a first waveguide region defining a first mode size; and
a second active waveguide region defining a second mode size smaller than the first mode size, wherein the second active waveguide region is optically coupled to the first waveguide region and wherein the second active waveguide region comprises a lower multiple quantum well layer and an upper multiple quantum well layer located above the lower multiple quantum well layer,
wherein the lower multiple quantum well layer is physically separated from the upper multiple quantum well layer by a spacer layer, and
wherein the upper multiple quantum well layer comprises a mode transformation region configured to reduce a size of an optical mode from the first mode size to the second mode size.

2. The semiconductor optical apparatus of claim 1, wherein the first waveguide region is a first waveguide active region comprising a further multiple quantum well layer and wherein a modal index defined by the further multiple quantum well layer is substantially equal to a modal index defined by the lower multiple quantum well layer.

3. The semiconductor optical apparatus of claim 1, wherein the mode transformation region of the upper multiple quantum well layer comprises a tapered width region increasing in width away from a start of the second active waveguide region, where the second active waveguide region is optically coupled to the first waveguide region.

4. The semiconductor optical apparatus of claim 1, wherein a thickness of the spacer layer is smaller than about 0.25 μm.

5. The semiconductor optical apparatus of claim 1, wherein the spacer layer comprises undoped indium phosphide or low doped indium phosphide having a concentration of less than about $10^{16}$ cm$^{-3}$.

6. The semiconductor optical apparatus of claim 1, wherein an optical confinement factor defined by the first waveguide region is about 0.2 to 0.3.

7. The semiconductor optical apparatus of claim 1, wherein an optical confinement factor defined by the second active waveguide region is about 0.47 or higher.

8. The semiconductor optical apparatus of claim 1, wherein the first waveguide region is butt-coupled to the lower multiple quantum well layer of the second active waveguide region.

9. The semiconductor optical apparatus of claim 1, wherein the semiconductor optical apparatus comprises a semiconductor optical amplifier or a semiconductor optical laser providing the first active waveguide region.

10. The semiconductor optical apparatus of claim 9, wherein the semiconductor optical laser is a ridge waveguide laser or a buried heterostructure laser.

11. The semiconductor optical apparatus of claim 1, wherein the first waveguide region and the second active waveguide region are monolithically integrated on a common substrate.

12. The semiconductor optical apparatus of claim 1, wherein the semiconductor optical apparatus further comprises a mode transformer for optically coupling the first waveguide region to the second active waveguide region.

13. A Mach Zehnder modulator comprising an input arm and at least one output arm, wherein the input arm and/or the output arm comprises a semiconductor optical apparatus, comprising:
a first waveguide region defining a first mode size; and
a second active waveguide region defining a second mode size smaller than the first mode size, wherein the second active waveguide region is optically coupled to the first waveguide region and wherein the second active waveguide region comprises a lower multiple quantum well layer and an upper multiple quantum well layer located above the lower multiple quantum well layer, wherein the lower multiple quantum well layer is physically separated from the upper multiple quantum well layer by a spacer layer, and wherein the upper multiple quantum well layer comprises a mode transformation region configured to reduce a size of an optical mode from the first mode size to the second mode size.

14. The Mach Zehnder modulator of claim 13, wherein the first waveguide region is a first waveguide active region comprising a further multiple quantum well layer and wherein a modal index defined by the further multiple quantum well layer is substantially equal to a modal index defined by the lower multiple quantum well layer.

15. The Mach Zehnder modulator of claim 13, wherein the mode transformation region of the upper multiple quantum well layer comprises a tapered width region increasing in width away from a start of the second active waveguide region, where the second active waveguide region is optically coupled to the first waveguide region.

16. The Mach Zehnder modulator of claim 13, wherein a thickness of the spacer layer is smaller than about 0.25 µm.

17. The Mach Zehnder modulator of claim 13, wherein the spacer layer comprises undoped indium phosphide or low doped indium phosphide having a concentration of less than about $10^{16}$ cm$^{-3}$.

18. The Mach Zehnder modulator of claim 13, wherein an optical confinement factor defined by the first waveguide region is about 0.2 to 0.3.

19. A method of manufacturing a semiconductor optical apparatus, wherein the method comprises the following steps:

growing a first waveguide region on a substrate and coating the first waveguide region with a cladding layer, wherein the first waveguide region defines a first mode size;

growing a lower multiple quantum well layer on the substrate;

growing a spacer layer on the lower multiple quantum well layer;

growing an upper multiple quantum well layer on the spacer layer, wherein the upper multiple quantum well layer and the lower multiple quantum well layer define a second active waveguide region optically coupled to the first waveguide region and wherein the second active waveguide region defines a second mode size smaller than the first mode size; and etching a mode transformation region into the upper multiple quantum well layer configured to reduce a size of an optical mode from the first mode size to the second mode size.

20. The method of claim 19, wherein the step of etching a mode transformation region into the upper multiple quantum well layer comprises the step of etching a tapered width region into the upper multiple quantum well layer increasing in width away from a start of the second active waveguide region, where the second active waveguide region is optically coupled to the first waveguide region.

* * * * *